(12) United States Patent
Chang et al.

(10) Patent No.: US 12,375,080 B2
(45) Date of Patent: Jul. 29, 2025

(54) FUSE STRUCTURE

(71) Applicant: Taiwan Semiconductor Manufacturing Company, Ltd., Hsinchu (TW)

(72) Inventors: Tun-Jen Chang, Hsinchu (TW); Bao-Ru Young, Hsinchu (TW); Tung-Heng Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/672,981

(22) Filed: May 23, 2024

(65) Prior Publication Data

US 2024/0313770 A1 Sep. 19, 2024

Related U.S. Application Data

(63) Continuation of application No. 17/407,402, filed on Aug. 20, 2021, now Pat. No. 11,996,837.

(51) Int. Cl.
*H03K 17/687* (2006.01)
*H01L 23/525* (2006.01)
*H10D 30/67* (2025.01)
*H10D 84/83* (2025.01)

(52) U.S. Cl.
CPC ..... *H03K 17/6871* (2013.01); *H01L 23/5256* (2013.01); *H10D 30/6735* (2025.01); *H10D 84/834* (2025.01)

(58) Field of Classification Search
CPC ............ H03K 17/6871; H01L 23/5256; H01L 27/0886; H01L 29/42392; H01L 29/785; H01L 23/5252; H01L 23/5329
See application file for complete search history.

(56) References Cited

U.S. PATENT DOCUMENTS

| | | |
|---|---|---|
| 6,670,824 B2 | 12/2003 | Goodbread |
| 9,287,000 B1 | 3/2016 | Liu |
| 2005/0218475 A1 | 10/2005 | Wu |
| 2014/0203396 A1 | 7/2014 | Wu |

(Continued)

OTHER PUBLICATIONS

Jhon Jhy Liaw et al., "Fuse Cell Structure", U.S. Appl. No. 16/944,756, filed Jul. 31, 2020, Assignee: Taiwan Semiconductor Manufacturing Co., Ltd., 30 pages specification, 24 pages drawings.

(Continued)

*Primary Examiner* — Metasebia T Retebo
(74) *Attorney, Agent, or Firm* — Haynes and Boone, LLP

(57) ABSTRACT

A fuse structure includes first and second transistors where each of the first and the second transistors has a source terminal, a drain terminal, and a gate terminal; a first source/drain contact disposed on the source terminal of the first transistor; a second source/drain contact disposed on the drain terminal of the second transistor; an insulator disposed laterally between the first and the second source/drain contacts; a source/drain contact via disposed on the first source/drain contact; and a program line connected to the source/drain contact via, wherein a width of the insulator is configured such that a programming potential applied across the source/drain contact via and the drain terminal of the second transistor causes the insulator to break down.

20 Claims, 4 Drawing Sheets

(56) References Cited

U.S. PATENT DOCUMENTS

| | | |
|---|---|---|
| 2014/0321965 A1 | 10/2014 | Rana |
| 2017/0200727 A1 | 7/2017 | Yoon |
| 2017/0236917 A1 | 8/2017 | Nowak |
| 2018/0174650 A1 | 6/2018 | Chung |
| 2019/0165045 A1 | 5/2019 | Chung |
| 2020/0365607 A1 | 11/2020 | Cheng |
| 2021/0098372 A1 | 4/2021 | Fu |
| 2021/0249423 A1 | 8/2021 | Chang |
| 2021/0249424 A1 | 8/2021 | Chang |
| 2023/0378356 A1* | 11/2023 | Paak .................. H01L 29/0653 |

OTHER PUBLICATIONS

Ta-Chun Lin, et al., "Isolation Structure for for Isolating Epitaxially Grown Source/Drain Regions and Method of Fabrication Thereof", U.S. Appl. No. 17/033,031, filed Sep. 25, 2021, Assignee: Taiwan Semiconductor Manufacturing Co., Ltd., 32 pages specification, 27 pages drawings.

Meng-Huan Jao, et al., "Process and Structure for Source/Drain Contacts", U.S. Appl. No. 17/338,384, filed Jun. 3, 2021, Assignee: Taiwan Semiconductor Manufacturing Company Ltd., 26 pages specification, 32 pages drawings.

* cited by examiner

FUSE STRUCTURE

CROSS-REFERENCE TO RELATED APPLICATIONS

This application is a continuation of U.S. patent application Ser. No. 17/407,402, filed Aug. 20, 2021, issuing as U.S. Pat. No. 11,996,837, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, fuses or anti-fuses have been used in ICs. An anti-fuse is a fuse that is normally open (i.e., two terminals of the fuse are open circuit or high impedance). After being programmed, the two terminals of the fuse are electrically shorted allowing a current to flow between the two terminals. Anti-fuses have been implemented using transistors and their breakdown path are usually from the transistors' gate to either the transistors' channel or the transistors' drain. As ICs continue to scale down, the reliability, operation margin, and resistance variation of such anti-fuses become a concern. New fuse structures with a different breakdown path are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
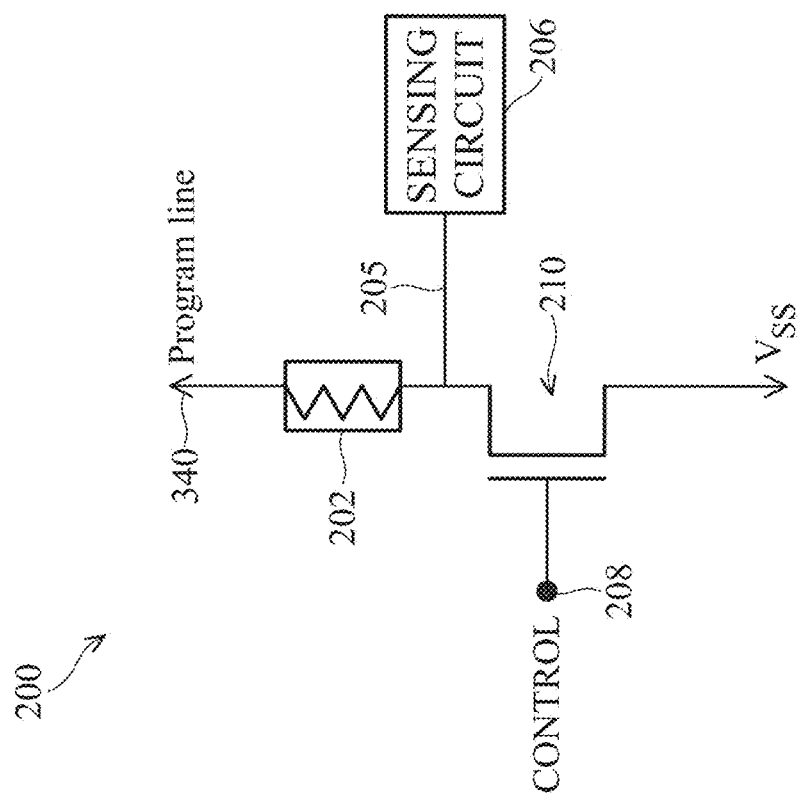
FIG. 1 illustrates a schematic view of a fuse structure of the present disclosure, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices. More particularly, the present disclosure is related to semiconductor devices having anti-fuses (or anti-fuse elements) integrated therewith. In the present disclosure, the terms anti-fuse and fuse are used interchangeably. Traditionally, anti-fuses are implemented using transistors and their breakdown paths are usually from the transistors' gate to either the transistors' channel or the transistors' drain. In other words, they work by breaking down the gate dielectric layer by applying a programming voltage to the transistors' gate. However, such anti-fuses may be adversely affected by the down-scaling of the transistors. For example, the reliability and operation margin of such anti-fuses might be impacted in certain designs when transistors become smaller or become three-dimensional such as in FinFET or gate-all-around devices. For example, gate oxide thickness has continuously shrunk in advanced process nodes to a point where it may not endure high programming voltages for gate oxide breakdown. Also, process changes implemented at front end of line (FEOL) and middle end of line (MEOL) processes sometime adversely affect the performance of anti-fuses. An object of the present disclosure is to overcome such issues. Particularly, the present disclosure provides a new type of anti-fuse with a new breakdown path that utilizes a source/drain contact via on a source/drain contact, an insulator implemented at the source/drain contact level, and a source/drain electrode that includes epitaxially-grown and heavily-doped semiconductor. In an embodiment of the present disclosure, one terminal of the fuse is the source/drain contact via and another terminal of the fuse is the source/drain electrode, and the two terminals are separated by the insulator. Before being programmed, the fuse exhibits a high resistance between the two terminals due to the insulator. During programming, a high voltage drop is provided between the two terminals to break down the insulator. Once programmed, the resistance between the two terminals in the fuse (which is effectively between metal and heavily-doped semiconductor) becomes very small. The change of resistance can be sensed by a sensing circuit. The insulator can be made much thicker than typical gate oxide layers. Therefore, a larger programming voltage can be used for the new type of fuses than for traditional fuses and more reliable programming can be achieved by the new type of fuses. These and other aspects of the new type of fuses are further discussed below in conjunction with FIGS. 1 through 3B, which illustrate schematic, cross-sectional, and/or layout views of a device 200 (or semiconductor device 200), in accordance with some embodiments.

In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, gate-all-around (GAA) transistors such as nanosheet FETs and nanowire FETs, other types of multi-gate FETs, metal-oxide semiconductor field effect transistors (MOSFETs or MOS FETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 200 includes a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 1-3B have been simplified for the sake of clarity to better understand the inventive concepts of the present disclosure. Additional features can be added in the device 200, and some of the features described below can be replaced, modified, or eliminated in other embodiments of the device 200.

FIG. 1 shows a schematic view of the device 200 having a fuse structure (or fuse) 202. One terminal of the fuse structure 202 is connected to a program line 340 which may be coupled to a programming voltage, such as $V_{CC}$. Another terminal of the fuse structure 202 is coupled to the drain terminal of an n-type MOSFET (metal oxide semiconductor field effect transistor) 210 (or NFET 210). The source terminal of NFET 210 is coupled to $V_{SS}$ or ground. The NFET 210 is an example of a driver device operable to supply a programming current and voltage drop across the fuse structure 202. A control signal is supplied to the gate terminal 208 of the NFET 210 that is operable to turn the NFET 210 ON or OFF. An output signal 205 at the drain terminal of the NFET 210 is supplied to a sensing circuit 206 that is operable to determine whether the fuse structure 202 is programmed. For example, the resistance of the fuse structure 202 is much higher in its unprogrammed state than in its programmed state, and the change of resistance can be detected by the sensing circuit 206.

Figure 2A:
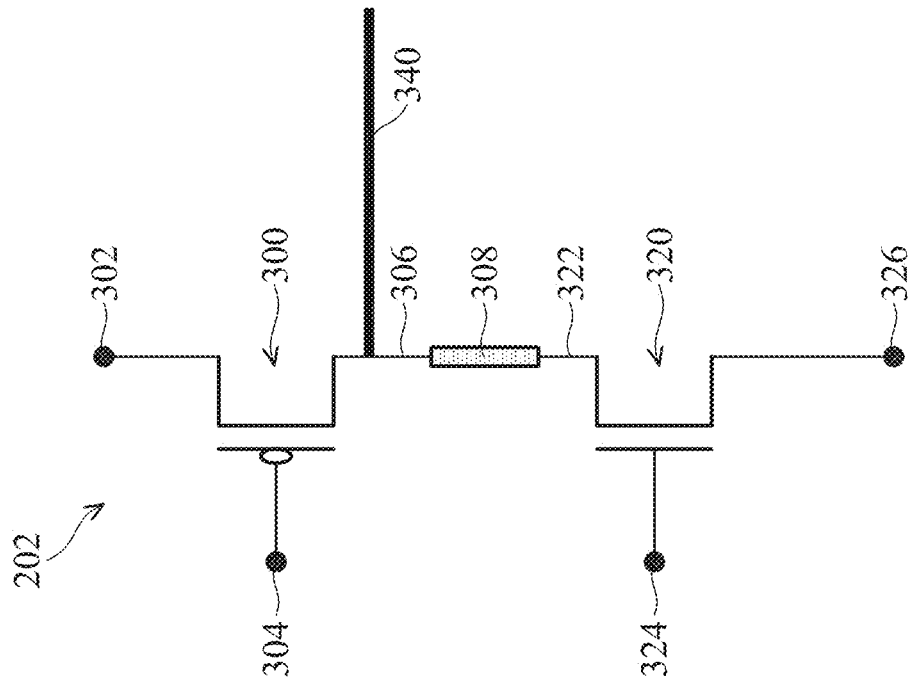
FIGS. 2A, 2B, 2C, and 2D illustrate a portion of the fuse structure of FIG. 1, according to embodiments of the present disclosure.

FIG. 2A illustrates a schematic view of the fuse structure 202 according to an embodiment. Referring to FIG. 2A, the fuse structure 202 includes two transistors 300 and 320. In this embodiment, both transistors 300 and 320 are n-type transistors (NFET). The transistor 300 includes a drain terminal 302, a source terminal 306, and a gate terminal 304. Similarly, the transistor 320 includes a drain terminal 322, a source terminal 326, and a gate terminal 324.

Still referring to FIG. 2A, the fuse structure 202 further includes an insulator 308 between the source terminal 306 and the drain terminal 322. Specifically, one end of the insulator 308 is coupled to the source terminal 306 and another end of the insulator 308 is coupled to the drain terminal 322. In other words, the insulator 308 separates the source terminal 306 from the drain terminal 322. The program line 340 of the device 200 is electrically connected to the source terminal 306 in this embodiment. According to an embodiment, in its unprogrammed state, the insulator 308 insulates the source terminal 306 from the drain terminal 322 and the electrical path from the drain terminal 302 to the source terminal 326 exhibits high resistance (or high impedance). During programming, a high voltage drop is applied to the two ends of the insulator 308 to break it down. Once the insulator 308 is broken down (i.e., the fuse structure 202 is in its programmed state), the source terminal 306 is electrically shorted to (or connected to) the drain terminal 322 and the electrical path from the drain terminal 302 to the source terminal 326 exhibits low resistance (or low impedance) when the gate terminals 304 and 324 are applied with a turn-on voltage for the respective transistors 300 and 320. In an embodiment, the gate terminals 304 and 324 are fixedly applied with (or tied to) a high operating voltage (such as Vcc) in the device 200 so that the transistors 300 and 320 are always turned on but there is no current flowing through the transistors 300 and 320 until the fuse structure 202 is programmed because the insulator 308 blocks the current from flowing through the transistors 300 and 320. In another embodiment, the transistors 300 and 320 are turned on when and only when the sensing circuit 206 is in operation and are turned off when the sensing circuit 206 is not in operation.

Figure 2B:
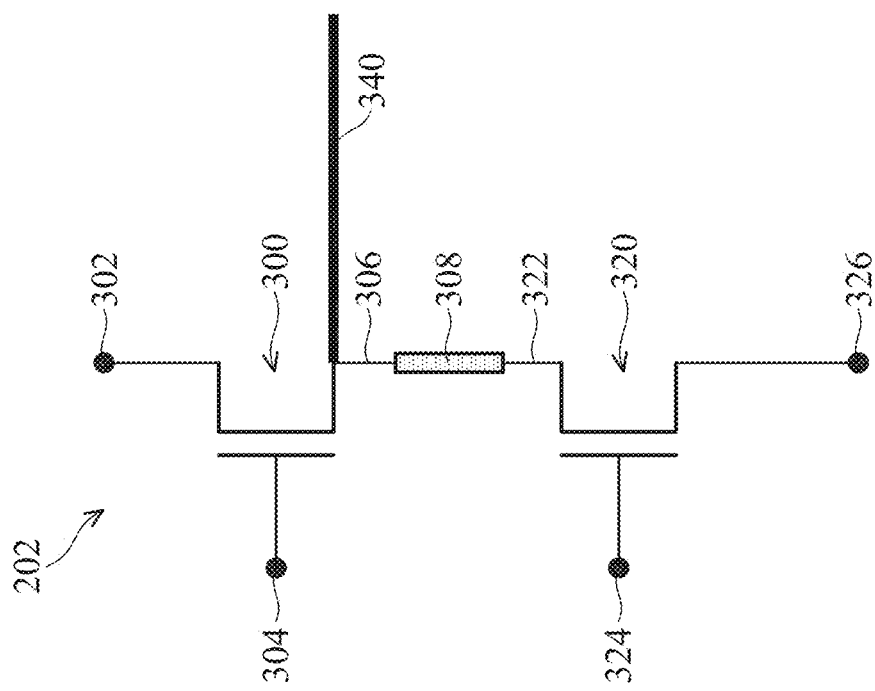

FIG. 2B illustrates a schematic view of the fuse structure 202 according to an alternative embodiment. In the embodiment shown in FIG. 2B, the transistor 300 is a p-type transistor (PFET) and the transistor 320 is an n-type transistor (NFET). The embodiment shown in FIG. 2B operates in substantially the same manner as the embodiment shown in FIG. 2A except for the gate terminal 304. In this embodiment, the gate terminal 304 may be fixedly applied with (or tied to) a low operating voltage while the gate terminal 324 may be fixedly applied with (or tied to) a high operating voltage so that the transistors 300 and 320 are always turned on. Alternatively, the gate terminal 304 may be applied with a low operating voltage and the gate terminal 324 may be applied with a high operating voltage when and only when the sensing circuit 206 is in operation.

Figure 2C:
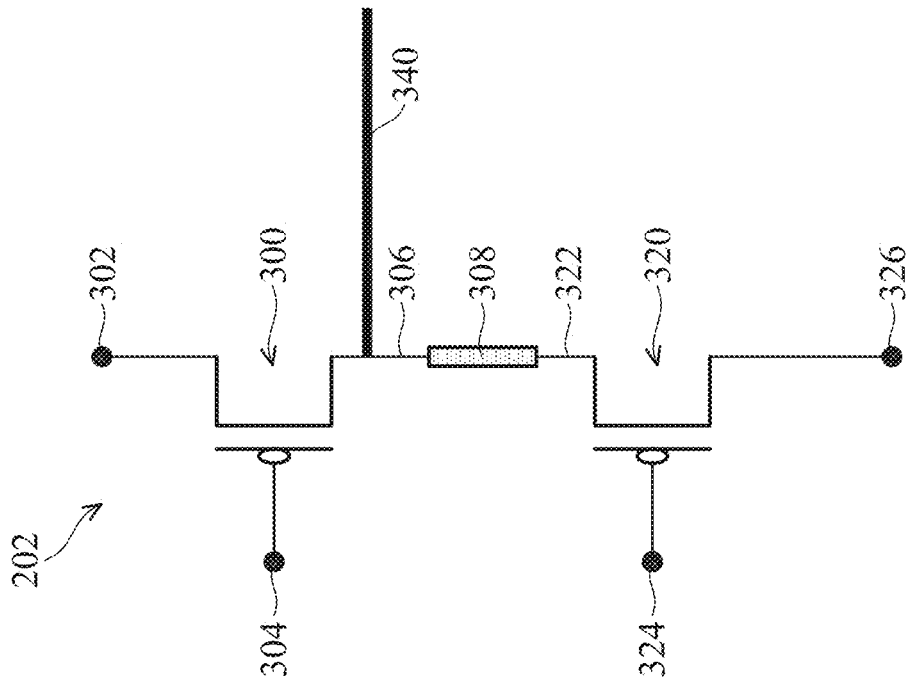

FIG. 2C illustrates a schematic view of the fuse structure 202 according to another alternative embodiment. In the embodiment shown in FIG. 2C, the transistor 300 is an n-type transistor (NFET) and the transistor 320 is a p-type transistor (PFET). The embodiment shown in FIG. 2C operates in substantially the same manner as the embodiment shown in FIG. 2A except for the gate terminal 324. In this embodiment, the gate terminal 304 may be fixedly applied with (or tied to) a high operating voltage while the gate terminal 324 may be fixedly applied with (or tied to) a low operating voltage so that the transistors 300 and 320 are always turned on. Alternatively, the gate terminal 304 may be applied with a high operating voltage while the gate terminal 324 may be applied with a low operating voltage when and only when the sensing circuit 206 is in operation.

Figure 2D:
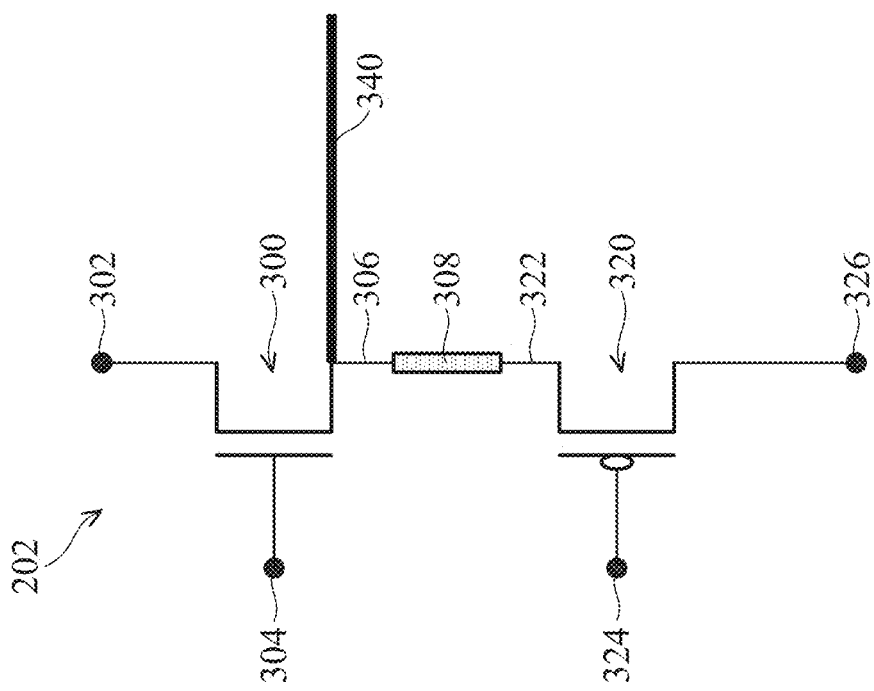

FIG. 2D illustrates a schematic view of the fuse structure 202 according to yet another alternative embodiment. In the embodiment shown in FIG. 2D, both the transistor 300 and the transistor 320 are p-type transistors (PFET). The embodiment shown in FIG. 2D operates in substantially the same manner as the embodiment shown in FIG. 2A except for the gate terminals 304 and 324. In this embodiment, the gate terminals 304 and 324 may be fixedly applied with (or tied to) a low operating voltage so that the transistors 300 and 320 are always turned on. Alternatively, the gate terminals 304 and 324 may be applied with a low operating voltage when and only when the sensing circuit 206 is in operation.

The transistors 300 and 320 in FIGS. 2A-2D and the transistor 210 in FIG. 1 can be any type of transistors including planar transistors, FinFET, and gate-all-around (GAA) transistors. A GAA transistor refers to a transistor having vertically-stacked horizontally-oriented multi-channels, such as a nanowire transistor and a nanosheet transistor. GAA transistors are promising candidates to take CMOS to the next stage of the roadmap due to their better gate control ability, lower leakage current, and fully FinFET layout compatibility.

Figures 3A, 3B:
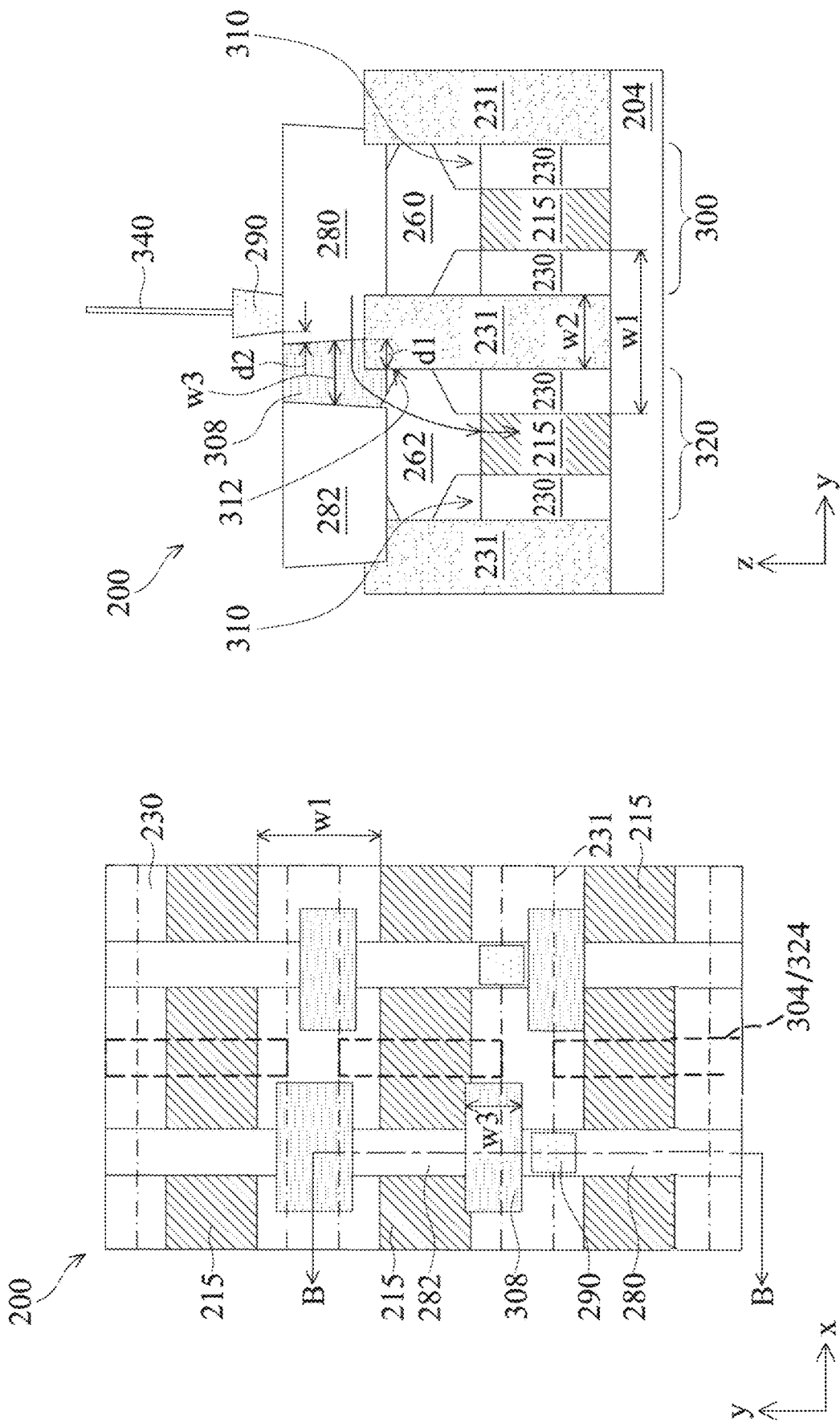
FIG. 3A illustrates a layout of a portion of a fuse structure, according to an embodiment.
FIG. 3B shows a cross-sectional view of a portion of the fuse structure in FIG. 3A along the "B-B" line of FIG. 3A, according to an embodiment.

FIG. 3A shows a layout view of a portion of the device 200 in FIG. 1 according to an embodiment, and FIG. 3B shows a cross-sectional view of a portion of the device 200 in FIG. 3A along the "B-B" line of FIG. 3A according to an embodiment. Referring to FIGS. 3A and 3B, the device 200 includes active regions 215 oriented lengthwise along the "x" direction. In the present embodiment, the active regions 215 are in the shape of fins. Thus, they are also referred to as fin active regions 215. The active regions 215 are isolated one from another by isolation structure 230 and dielectric fins 231. The active regions 215, the isolation structure 230, and the dielectric fins 231 are disposed on a substrate 204.

The transistors 300 and 320 are formed on or in the active regions 215. Each transistor 300 and 320 includes source/drain structures. For example, the transistor 300 includes source/drain structures 260, and the transistor 320 includes source/drain structures 262. The source/drain structures expand (along the "y" direction) to the full width of the space between two adjacent dielectric fins 231. The source/drain structures may have multiple facets and may have a bar shape, a diamond shape, or other suitable shape. In the present embodiment, the source/drain structure 260 corresponds to the source terminal 306 of the transistor 300 as illustrated in FIGS. 2A-2D. Similarly, the source/drain structure 262 corresponds to the source terminal 306 of the transistor 320 as illustrated in FIGS. 2A-2D.

The device 200 further includes source/drain contacts that are disposed on the source/drain structures. For example, the device 200 includes a source/drain contact 280 disposed on the source/drain structure 260 and a source/drain contact 282 disposed on the source/drain structure 262. The source/drain contacts are oriented lengthwise along the "y" direction. In an embodiment, the source/drain contacts on the same line along the "y" direction is initially formed as one continuous piece of a conductive material and is then cut into segments which become the individual source/drain contacts. The space between the individual source/drain contacts are filled with an insulating material, which become the insulator 308.

As shown in FIGS. 3A and 3B, the insulator 308 is disposed laterally (along the "y" direction) between two adjacent source/drain contacts 280, 282. The top surface of the insulator 308 and the top surfaces of the source/drain contacts 280, 282 are substantially coplanar. The insulator 308 is disposed on and above the dielectric fin 231. Further, the insulator 308 is disposed on and above some of the source/drain structures, such as the source/drain structure 262. In the embodiment shown in FIG. 3B, the insulator 308 directly contacts a side surface of the source/drain structure 262 and is separated from the source/drain structure 260 by the dielectric fin 231. A portion of the insulator 308 is disposed laterally (along the "y" direction) between the source/drain structure 262 and the dielectric fin 231. In an embodiment, the insulator 308 directly contacts the source/drain contacts on the left and right sides of the insulator 308 and directly contacts one of the source/drain structures (such as the source/drain structure 262) and one of the dielectric fins 231 on the bottom side of the insulator 308.

As shown in FIGS. 3A and 3B, the device 200 further includes source/drain contact vias disposed on some of the source/drain contacts. For example, the device 200 includes a source/drain contact via 290 disposed on the source/drain contact 280. According to an embodiment, the program line 340 may be electrically coupled to the source/drain contact via 290. For example, the program line 340 may be implemented as vias and metal lines in a multi-layer interconnect (not shown) that are electrically connected to the source/drain contact via 290. Although not shown, the device 200 further includes one or more inter-layer dielectric layers that cover the dielectric fins 231, the source/drain contacts 280, 282, the insulator 308, and the source/drain contact via 290.

As illustrated as a curved arrow in FIG. 3B, an electrical breakdown path is provided from the source/drain contact 280 to the source/drain structure 262. This path is open before the fuse structure 202 is programmed. In other words, the insulator 308 insulates the source/drain structure 262 and the source/drain contact 282 from the source/drain structure 260 and the source/drain contact 280 when the fuse structure 202 is not programmed. During programming, a high voltage drop is applied across this path (for example, between the source/drain contact via 290 and the source/drain structure 262) and causes the insulator 308 to break down. Thereafter, the source/drain structure 262 and the source/drain contact 282 are electrically shorted to the source/drain structure 260 and the source/drain contact 280, allowing current to pass between the source terminal 306 and the drain terminal 322.

The width w3 of the insulator 308 is tuned to work with an appropriate programming voltage, such as 3.0 Volts or other suitable voltage levels. In an embodiment, the width w3 of the insulator 308 is in a range of about 18 nm to about 24 nm from a top view and along the "y" direction in FIGS. 3A and 3B. If the width w3 is too large (for example, larger than 24 nm), it might require a very high programming voltage (for example, higher than 3.0 Volts) which may not be readily available in some integrated circuits. Also, such very high programming voltage might affect the operation of other parts of the device 200 due to its strong electrical field. If the width w3 is too small (for example, smaller than 18 nm), then the insulator 308 might be prone to break down at low voltages and its reliability may be compromised. In embodiments where the width of the insulator 308 varies along the "z" direction, the narrowest width of the insulator 308 is taken as the width w3. In an embodiment, the insulator 308 includes undoped silicon, such as undoped polycrystalline silicon or amorphous silicon. In alternative embodiments, the insulator 308 includes $SiO_2$, SiOC, SiON, SiOCN, SiC, $Si_3N_4$, carbon doped $SiO_2$, nitrogen doped $SiO_2$, carbon and nitrogen doped $SiO_2$, dielectric metal oxide, or a combination thereof. The material(s) for the insulator 308 in conjunction with its width w3 are selected to meet the breakdown criteria discussed above.

In various embodiments, the substrate 204 includes silicon. Alternatively or additionally, substrate 204 includes another elemental semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 204 is a semiconductor-on-insulator substrate, such as a silicon-on-insulator (SOI) substrate, a silicon germanium-on-insulator (SGOI) substrate, or a germanium-on-insulator (GOI) substrate.

The active regions 215 may include the same semiconductor material(s) as the substrate 204 or may include different semiconductor material(s) than the substrate 204. For example, the active regions 215 may include silicon; germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. The space between two adjacent active regions 215 may have a dimension w1 that is in a range of about 35 nm to about 45 nm in some embodiments.

Each of the source/drain structures 260 and 262 may include one or more epitaxially grown semiconductor materials doped with certain n-type or p-type dopants. The source/drain structures 260 and 262 may be formed by epitaxially growing semiconductor material(s) (e.g., Si, SiGe), for example, using CVD deposition techniques (e.g., Vapor Phase Epitaxy), molecular beam epitaxy, other suitable epitaxial growth processes, or combinations thereof. As discussed above, each of the transistors 300 and 320 can be an n-type transistor or a p-type transistor in various embodiments. In an embodiment where the transistor 300 is an n-type transistor, the source/drain structures 260 may include silicon and be doped with n-type dopants such as carbon, phosphorous, arsenic, other n-type dopant, or combinations thereof. In an embodiment where the transistor 300 is a p-type transistor, the source/drain structures 260 may include silicon germanium or germanium and be doped with p-type dopants such as boron, other p-type dopant, or combinations thereof. Similarly, in an embodiment where the transistor 320 is an n-type transistor, the source/drain structures 262 may include silicon and be doped with n-type dopants such as carbon, phosphorous, arsenic, other n-type dopant, or combinations thereof, and in an embodiment where the transistor 320 is a p-type transistor, the source/drain structures 262 may include silicon germanium or germanium and be doped with p-type dopants such as boron, other p-type dopant, or combinations thereof.

The isolation structure 230 includes silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures, deep trench isolation (DTI) structures, and/or local oxidation of silicon (LOCOS) structures. Isolation structure 230 can include multiple layers of insulating materials, such as having a thermal oxide liner layer and a silicon nitride layer on the thermal oxide liner layer.

In an embodiment, the dielectric fins 231 are disposed lengthwise along the "x" direction (i.e., parallel to the active regions 215) and are substantially even spaced out from nearby fin active regions 215. The dielectric fin 231 has a width w2 along the "y" direction. In an embodiment, the width w2 is in a range of about 15 nm to 20 nm. In some embodiments, each dielectric fin 231 includes multiple layers of dielectric materials. For example, the dielectric fin 231 may include a dielectric liner layer, a dielectric fill layer over the dielectric liner layer, and a dielectric helmet over the dielectric fill layer and the dielectric liner layer. In various embodiments, the dielectric fin 231 may include silicon oxide, silicon nitride, silicon oxynitride, TEOS formed oxide, PSG, BPSG, low-k dielectric material, high-k dielectric material, other suitable dielectric material, or combinations thereof. In an embodiment, the upper portion of the dielectric fin 231 that is in contact with the insulator 308 includes a high-k dielectric material. Low-k dielectric material generally refers to dielectric materials having a low dielectric constant, for example, lower than that of silicon oxide ($k \approx 3.9$). Example low-k dielectric materials include FSG, carbon doped silicon oxide, Xerogel, Aerogel, amorphous fluorinated carbon, Parylene, BCB, polyimide, or combinations thereof. High-k dielectric material generally refers to dielectric materials having a high dielectric constant, for example, greater than that of silicon oxide ($k \approx 3.9$). Examples of high-k dielectric materials include $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof.

In some embodiments as shown in FIG. 3B, the device 200 includes air gaps 310 enclosed by the isolation structure 230, the active regions 215, the dielectric fins 231, and the source/drain structures 260 or 262. In some embodiments as shown in FIG. 3B, the device 200 includes an air gap 312 enclosed by the dielectric fins 231, and the source/drain structures 260 or 262, and the insulator 308. In some embodiments, an etch stop layer (not shown) is disposed on top and side surfaces of the source/drain structures 260 or 262 where the source/drain contacts 280, 282 are not present. The etch stop layer may include silicon nitride or other suitable materials in some embodiments. In some embodiments, a silicide layer (not shown) is disposed between the source/drain structures 260, 262 and the respective source/drain contacts 280, 282. The silicide layer may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In some embodiments, the source/drain contacts 280, 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes.

In some embodiments, the source/drain contact via 290 may include titanium (Ti), tantalum (Ta), tungsten (W), cobalt (Co), ruthenium (Ru), molybdenum (Mo), nickel (Ni), copper (Cu), or other metals or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. In the embodiment depicted in FIG. 3B, the source/drain contact via 290 is disposed above the source/drain contact 280 and over the source/drain structure 260. In an alternative embodiment, the source/drain contact via 290 is disposed above the source/drain contact 282 and over the source/drain structure 262. The source/drain contact via 290 may have a square shape, a rectangular shape, or other suitable shapes. The width of the contact via 290 along the "y" direction may be in a range from about 10 nm to about 15 nm in some embodiments.

Further, in an embodiment, both the source/drain structure 260 and the source/drain structure 262 are n-type doped, which corresponds to the fuse structure 202 shown in FIG. 2A. In another embodiment, the source/drain structure 260 is p-type doped and the source/drain structure 262 is n-type doped, which corresponds to the fuse structure 202 shown in FIG. 2B. In another embodiment, the source/drain structure 260 is n-type doped and the source/drain structure 262 is p-type doped, which corresponds to the fuse structure 202 shown in FIG. 2C. In yet another embodiment, both the source/drain structure 260 and the source/drain structure 262 are p-type doped, which corresponds to the fuse structure 202 shown in FIG. 2D.

In some embodiments, the insulator 308 is placed such that it is offset from (or partially overlapping with) the dielectric fin 231 from a top view, which ensures that it touches both the source/drain contact 280 and the source/drain structure 262 even though it is relatively narrow. If the insulator 308 is center-aligned with the dielectric fin 231 from a top view, it may be too wide for fuse programming. As shown in FIG. 3B, the insulator 308 overlaps with the dielectric fin 231 by a distance d1 along the "y" direction where the distance d1 is in a range of about 4 nm to about 10 nm, such as from about 5 nm to about 9 nm. Such overlapping distance ensures proper fuse operations. For example, it ensures that the source/drain contact 280 and the source/drain structure 262 are sufficiently insulated when the fuse structure 202 is in its unprogrammed state. If the overlapping distance d1 is too small (such as less than 4 nm), the source/drain contact 280 and the source/drain structure 262 may be shorted due to TDDB (time dependent dielectric breakdown) even when the fuse structure 202 is not programmed. If the overlapping distance d1 is too large (such as more than 10 nm), the programming voltage for the fuse structure 202 might be too large. The source/drain contact via 290 may be placed close to the insulator 308. For example, the distance d2 between the source/drain contact via 290 and the insulator 308 may be in a range of about 0.5 nm to about 1.8 nm. Placing the source/drain contact via 290 close to the insulator 308 ensures effective programming operation to the fuse structure 202.

FIG. 3A also illustrates the gate terminals 304 and 324 in dashed boxes. The gate terminals 304 and 324 are oriented lengthwise along the "y" direction. In some embodiments, the gate terminals 304 and 324 include high-k metal gates. For example, the gate terminals 304 and 324 may include a high-k gate dielectric layer engaging the channel regions of the active regions 215 and one or more metal layers on the high-k gate dielectric layer. The one or more metal layers may include one or more work function metal layers tuned for n-type or p-type work functions. Example materials for the high-k gate dielectric layer include $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. Example n-type work function metals include titanium, aluminum, tantalum carbide, tantalum carbide nitride, tantalum silicon nitride, or combinations thereof. Example p-type work function metals include titanium nitride, tantalum nitride, ruthenium, molybdenum, tungsten, platinum, or combinations thereof.

The device 200 may include various elements not shown or discussed above, such as inter-layer dielectric layer(s), metal interconnects, and so on.

Although not intended to be limiting, one or more embodiments of the present disclosure provide many benefits to an integrated circuit and the formation thereof. For example, embodiments of the present disclosure provide a new type of anti-fuse (or fuse) whose breakdown path goes from a source/drain contact on a source/drain structure to a nearby source/drain structure where the two source/drain structures belong to two transistors. The source/drain contact and the nearby source/drain structure are separated by an insulator, which can be broken down by applying a programming voltage during fuse programming. Because the insulator can be made much thicker than a typical gate dielectric layer, the programming voltage can be made high than in approaches where the breakdown path is through a typical gate dielectric layer. Further, the two transistors can be the same type (for example, both are NFET or both are PFET), or can be different types (for example, one is NFET and the other is PFET), which increases the design flexibility. Embodiments of the present disclosure can be readily integrated into existing manufacturing flow.

In one example aspect, the present disclosure is directed to a fuse structure. The fuse structure includes first and second transistors where each of the first and the second transistors has a source terminal, a drain terminal, and a gate terminal; a first source/drain contact disposed on the source terminal of the first transistor; a second source/drain contact disposed on the drain terminal of the second transistor; an insulator disposed laterally between the first and the second source/drain contacts; a source/drain contact via disposed on the first source/drain contact; and a program line connected to the source/drain contact via, wherein a width of the insulator is configured such that a programming potential applied across the source/drain contact via and the drain terminal of the second transistor causes the insulator to break down.

In an embodiment, the fuse structure further includes a dielectric fin disposed between the source terminal of the first transistor and the drain terminal of the second transistor, wherein the insulator is disposed on the dielectric fin. In a further embodiment, the insulator overlaps with the dielectric fin by about 4 nm to about 9 nm from a top view.

In some embodiment of the fuse structure, the width of the insulator is in a range of about 18 nm to about 24 nm. In some embodiment, the insulator includes silicon. In some embodiment, the insulator includes $SiO_2$, SiOC, SiON, SiOCN, SiC, $Si_3N_4$, carbon doped $SiO_2$, nitrogen doped $SiO_2$, carbon and nitrogen doped $SiO_2$, dielectric metal oxide, or a combination thereof.

In an embodiment, the source terminal of the first transistor and the drain terminal of the second transistor include epitaxially-grown semiconductor material doped with a same type of dopant. In another embodiment, the source terminal of the first transistor and the drain terminal of the second transistor include epitaxially-grown semiconductor material doped with different types of dopant. In yet another embodiment, each of the first and the second transistors is a FinFET or a gate-all-around transistor.

In another example aspect, the present disclosure is directed to a fuse structure. The fuse structure includes first and second transistors over a substrate, the first transistor having a source terminal, the second transistor having a drain terminal, each of the source and the drain terminals having an epitaxially grown semiconductor material. The fuse structure further includes a dielectric fin separating the source terminal and the drain terminal, wherein both the source terminal and the drain terminal directly contact the dielectric fin; a first contact disposed on the source terminal and the dielectric fin; a second contact disposed on the drain terminal; an insulator disposed between the first and the second contacts and between the second contact and the dielectric fin; and a contact via disposed on the first contact, wherein the insulator is configured such that a programming voltage applied to the contact via causes the insulator to break down, thereby electrically connecting the source terminal to the drain terminal.

In an embodiment of the fuse structure, each of the source terminal and the drain terminal includes epitaxially grown silicon doped with an n-type dopant. In another embodiment, each of the source terminal and the drain terminal includes epitaxially grown silicon germanium doped with a p-type dopant.

In an embodiment, one of the source terminal and the drain terminal includes epitaxially grown silicon doped with an n-type dopant and the other of the source terminal and the drain terminal includes epitaxially grown silicon germanium doped with a p-type dopant. In another embodiment, a width of the insulator is in a range of about 18 nm to about 24 nm from a top view. In another embodiment, the insulator includes undoped silicon. In yet another embodiment, each of the first and the second transistors is a FinFET or a gate-all-around transistor.

In yet another example aspect, the present disclosure is directed to a fuse structure that includes first and second transistors, each of the first and the second transistors having a source terminal, a drain terminal, and a gate terminal. The fuse structure further includes a dielectric fin sandwiched between the source terminal of the first transistor and the drain terminal of the second transistor; a first contact disposed on the source terminal of the first transistor; a second contact disposed on the drain terminal of the second transistor; an insulator disposed laterally between the first and the second contacts and directly on the dielectric fin and the drain terminal of the second transistor; a contact via disposed on the first contact; a program line electrically connected to the contact via, and a sensing circuit connected to the source terminal of the second transistor. The insulator is configured such that a programming voltage applied to the contact via through the program line causes the insulator to break down, thereby electrically connecting the source terminal of the first transistor to the drain terminal of the second transistor.

In an embodiment of the fuse structure, the insulator includes undoped silicon or a dielectric material. In a further embodiment, from a top view, a width of the insulator is in a range of about 18 nm to about 24 nm and the insulator overlaps with the dielectric fin by about 5 nm to about 9 nm. In another embodiment, from a top view, the contact via is spaced from the insulator by a distance in a range from about 0.5 nm to about 1.8 nm.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A fuse structure, comprising:
   a first active region extending in a first direction and a second active region extending in the first direction, wherein a space interposes the first active region and the second active region in a second direction perpendicular to the first direction in a top view, a first epitaxial source/drain structure disposed over the first active region and a second epitaxial source/drain structure disposed over the second active region;
   a first source/drain contact disposed on the first epitaxial source/drain structure and extending in the second direction having a length in the second direction greater than a width in the first direction;
   a second source/drain contact disposed on the second epitaxial source/drain structure and extending in the second direction having a length in the second direction greater than a width in the first direction;
   an insulator disposed laterally between each of the first and the second source/drain contacts, and extending in the first direction having a length in the first direction greater than a width in the second direction;
   a dielectric fin disposed between the first active region and the second active region, wherein the insulator is disposed on the dielectric fin;
   a source/drain contact via disposed on the first source/drain contact, the source/drain contact being disposed in the space in the top view; and
   a program line connected to the source/drain contact via.

2. The fuse structure of claim 1, wherein the insulator is disposed directly on the dielectric fin.

3. The fuse structure of claim 1, wherein the insulator overlaps with the dielectric fin by about 4 nm to about 9 nm from a top view.

4. The fuse structure of claim 1, wherein the insulator physically interfaces about 4 nm to about 9 nm of an uppermost surface of the dielectric fin.

5. The fuse structure of claim 1, wherein the source/drain contact via interfaces the first source/drain contact at a first region, wherein the first region is spaced a lateral distance from the insulator.

6. The fuse structure of claim 5, wherein the lateral distance is about 0.5 nm to about 1.8 nm.

7. The fuse structure of claim 1, wherein the insulator includes $SiO_2$, SiOC, SiON, SiOCN, SiC, $Si_3N_4$, carbon doped $SiO_2$, nitrogen doped $SiO_2$, carbon and nitrogen doped $SiO_2$, dielectric metal oxide, or a combination thereof.

8. The fuse structure of claim 1, wherein in the top view the second source/drain contact overlaps the second active region.

9. The fuse structure of claim 1, wherein the first source/drain contact extends from a first dielectric fin between the first active region and a first side of the second active region, and a second dielectric fin adjacent a second side of the second active region.

10. A fuse structure, comprising:
first and second transistors over a substrate, the first and second transistors having separate gate terminals, the first transistor having a source terminal, the second transistor having a drain terminal, a first semiconductor material of a source terminal and a second semiconductor material of a drain terminal disposed on adjacent active regions;
a first dielectric fin extending from the substrate and separating the first and second semiconductor materials in a cross-sectional view;
a second dielectric fin extending above the substrate and adjacent a second side of the source terminal opposite the first dielectric fin;
a first contact disposed on the first semiconductor material of the source terminal and the first dielectric fin, wherein the first contact extends over a first portion of the first dielectric fin and at least a portion of the second dielectric fin;
a second contact disposed on the second semiconductor material of the drain terminal;
an insulator disposed between the first and the second contacts, and the insulator further disposed between the second contact and a second portion of the first dielectric fin in the cross-sectional view; and
a contact via disposed on the first contact.

11. The fuse structure of claim 10, further comprising: a conductive line disposed on and interfacing the contact via.

12. The fuse structure of claim 10, wherein a breakdown path is provided from the first contact through the insulator to the second semiconductor material of the drain terminal.

13. The fuse structure of claim 10, wherein the insulator extends from a sidewall of the first contact to a sidewall of the second contact.

14. The fuse structure of claim 10, wherein the insulator has a length in a first direction in a top view and a width, less than the length, in a second direction in the top view, wherein the width is less than the length.

15. A fuse structure, comprising:
first and second transistors formed on adjacent active regions of a substrate, the first and second transistors having separate gate terminals, and each of the first and the second transistors having a source/drain structure disposed over respective ones of the adjacent active regions;
a dielectric fin extending above the substrate, the dielectric fin disposed between the source/drain structure of the first transistor and the source/drain structure of the second transistor;
a first contact disposed on the source/drain structure of the first transistor, wherein the first contact has a terminal edge over the dielectric fin;
a second contact disposed on the source/drain structure of the second transistor;
an insulator disposed laterally between and contacting each of the first and the second contacts, and the insulator further disposed directly on an upper surface of the dielectric fin and a sidewall of the dielectric fin;
a contact via disposed on the first contact;
a program line electrically connected to the contact via; and
a sensing circuit connected to the source/drain structure of the second transistor.

16. The fuse structure of claim 15, wherein the insulator includes undoped silicon or a dielectric material.

17. The fuse structure of claim 15, wherein the first contact extends in a first direction in a top view, and the second contact extends in the first direction in the top view.

18. The fuse structure of claim 17, wherein where active regions extend in a second direction in the top view, the second direction is perpendicular to the first direction.

19. The fuse structure of claim 15, wherein an isolation structure is disposed between the dielectric fin and each of the adjacent active regions.

20. The fuse structure of claim 15, wherein a top surface of the dielectric fin is above a bottommost surface of the first contact.

* * * * *